United States Patent [19]

Nishihashi et al.

[11] Patent Number: 5,038,255
[45] Date of Patent: Aug. 6, 1991

[54] VEHICLE LAMP

[75] Inventors: Jun Nishihashi, Hiratsuka; Toshiyuki Kondo, Ichikawa; Masato Ono, Yokohama; Hirokazu Shiroishi, Hiratsuka; Osamu Waki, Mitaka, all of Japan

[73] Assignees: Stanley Electric Co., Ltd.; Furukawa Electric Co., Ltd., both of ; JPX

[21] Appl. No.: 595,247

[22] Filed: Oct. 10, 1990

[30] Foreign Application Priority Data

Sep. 9, 1989 [JP] Japan .................... 1-287598

[51] Int. Cl.⁵ .......................... B60Q 1/00; F21V 1/00
[52] U.S. Cl. ........................ 362/61; 362/226; 362/238; 362/240; 362/373; 362/800
[58] Field of Search ............... 362/61, 80, 238, 240, 362/249, 226, 362, 373, 800

[56] References Cited

U.S. PATENT DOCUMENTS

| 4,177,502 | 12/1979 | Hiscock | 362/240 X |
| 4,254,453 | 3/1981 | Mouyard et al. | 362/240 |
| 4,729,076 | 3/1988 | Masami et al. | 362/373 X |
| 4,733,335 | 3/1988 | Serizawa et al. | 362/373 X |
| 4,951,179 | 8/1990 | Machida | 362/800 X |

Primary Examiner—Stephen F. Husar
Attorney, Agent, or Firm—Louis Weinstein

[57] ABSTRACT

A vehicle lamp is mounted on vehicles such as automobiles. The lamp has an inner chamber constructed by a lamp housing and a lens, respectively having long shapes. In the chamber, there is a long light source fixing face member on which plural light sources are fixed. All light sources or electric bulbs are neatly fitted to convex or concave guide portions. Circuit patterns are printed on an inner face of the housing. Terminals of the light sources come into contact with the circuit patterns. The housing is made of particular synthetic resin having a good heat conductivity, so that no heat is accumulated in the chamber.

12 Claims, 3 Drawing Sheets

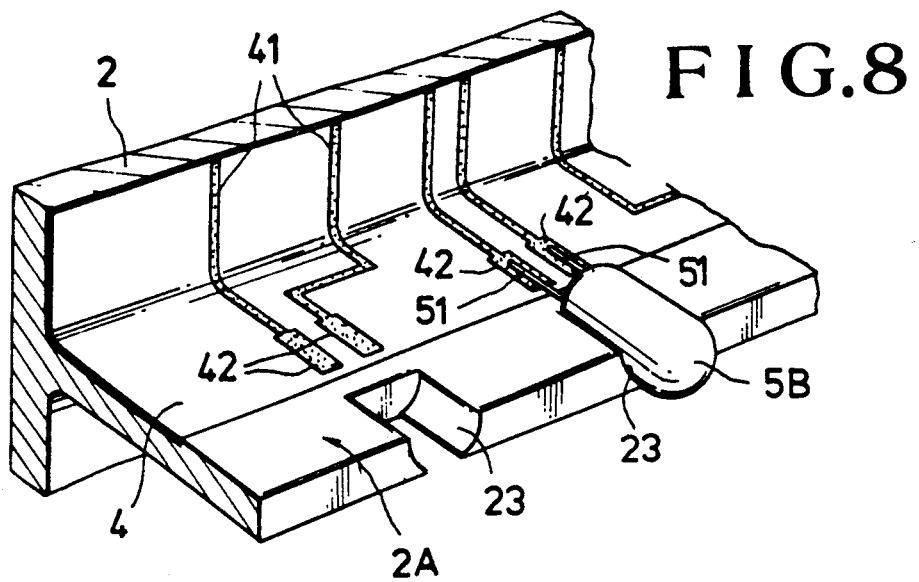
FIG.8
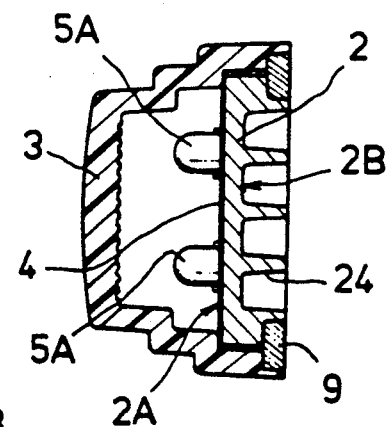
FIG.9
FIG.10
(PRIOR ART)
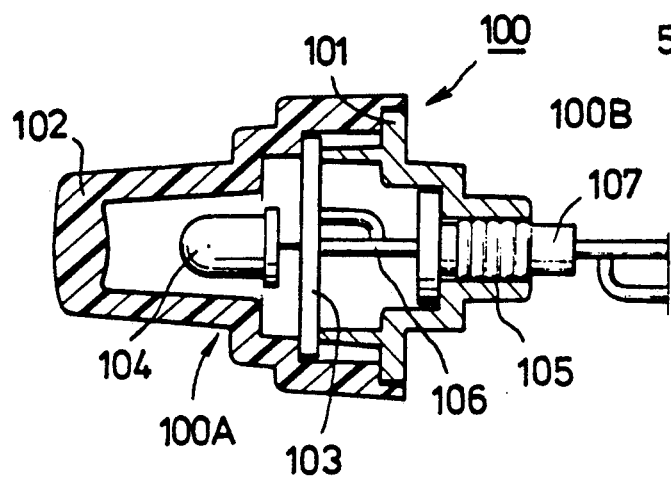

VEHICLE LAMP

FIELD OF INVENTION

The present invention relates to signal lamp such as stop lamp to be mounted on vehicles such as a motor vehicle.

PRIOR ART

The conventional vehicle lamp 100 of this kind shown in FIG. 10 has a lamp chamber 100A consisted of a housing 101 and a lens 102, in which lamp chamber a light source fixing face 103 of a printed circuit substrate is provided so as to be sandwiched between, for example, the housing 101 and the lens 102. A plurality of light sources 104 of, for example, LEDs (Light-Emitting Diode) are provided on a front face of the light source fixing face 103 in a row.

The lamp chamber 100A has a through hole 105 formed in a part of the chamber. Leads 106 connected to the light source fixing face 103 contact with a power source connecting portion 100B by extending the leads 106 through the through hole 105 and a water-sealed grommet 107 and out of the hole. After extending the leads 106, the housing 101 and the lens 102 are adhered through whole circumferences of them by a bond, so that the housing 101, lens 102 and water-sealed grommet 107 make the interior of the lamp chamber 100A an air-tight condition.

Such conventional vehicle lamps have several shortcomings shown below.

1. A space is necessary in back of the light source fixing face 103 for the lead 105 to be operatively installed. Consequently, a whole depth of the vehicle lamp 100 thickens and installation of the vehicle lamp 100 to a motor vehicle is made difficult.
2. Because the light source fixing face 103 is sandwiched between the housing 101 and the lens 102, as well as the provision of the space above, the light source fixing face 103 is of a floating condition in the lamp chamber 100A. As a result, heat generated from the light sources 104 which are lit is retained, raising the temperature of the chamber 100A, in particular in case the light sources 104 are LEDs, brightness of the LEDs will decrease due to raised temperature of the air surrounding the LED's.
3. Because the light source fixing face 103 is made of printed circuit substrates, the leads are apt to bend when the light sources 104 are fixed to the substrates. As a result, the order of positions of the light sources 104 will be disturbed or in disorder, deteriorating considerably the dignity or appearance of the whole lamp device 100.
4. Very troublesome works and processes are necessary to construct or assemble the light source connecting portion 100B, for example, an inserting process of the leads 106 through the grommet 107 reducing the production efficiency of the lamp device 100. In addition, the troublesome works deteriorate waterproofness of the light device 100, so that submersion accidents often happen on the devices.

Consequently, it is the purpose of the present invention to solve the above-identified shortcomings of conventional vehicle lamps.

According to the concrete embodiment of the vehicle lamp of the present invention solving the problems of the prior art, a vehicle lamp having a lamp chamber constructed of a housing and a lens, a light source fixing face placed in the lamp chamber, a plurality of light sources arranged on the fixing face, and a light source connecting portion provided at a part of the lamp chamber is provided, wherein the housing is made of synthetic resin improved in heat conductivity by adding particular filler, and has circuit patterns provided or formed integrally on an inner surface of the housing so as to be electrically connected to the light source and a convex or concave guide portion for suitably positioning the light sources, said guide portion being used as the light source fixing face, terminals protrude from the fixing face out of the housing, said terminals being used as the power source connecting portion or a control signal connecting portion, the housing and lens having a large clearance in their longitudinal direction and being adhered through flexible sealant material in order to construct the lamp chambers.

BRIEF DESCRIPTION OF THE DRAWING

FIG. 8 is a perspective view of a part of the vehicle lamp according to a second embodiment of the present invention;

FIG. 9 is a section of a vehicle lamp of the third embodiment;

and FIG. 10 is a sectional view of the conventional vehicle lamp.

EMBODIMENTS

Figure 1:
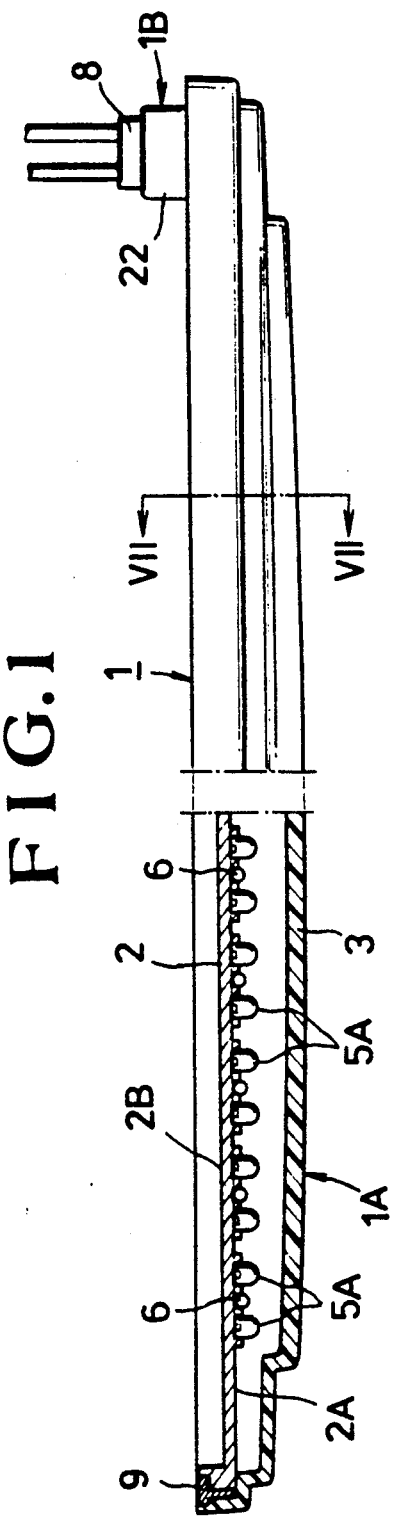
FIG. 1 is a side view of a part of the vehicle lamp, broken in part, according to a first embodiment of the present invention.

The present invention will be explained in detail with reference to the first embodiment shown in the drawings.

Figure 2:
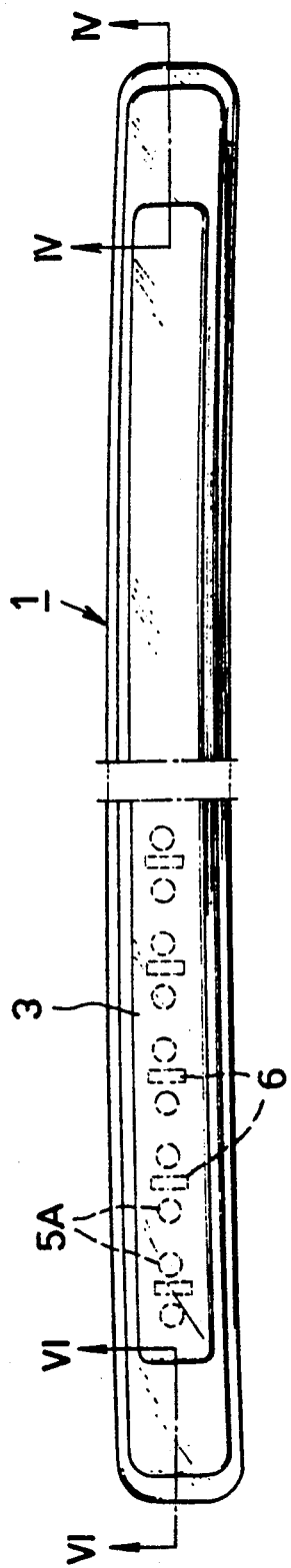
FIG. 2 is a front view similar to FIG. 1.
Figure 3:
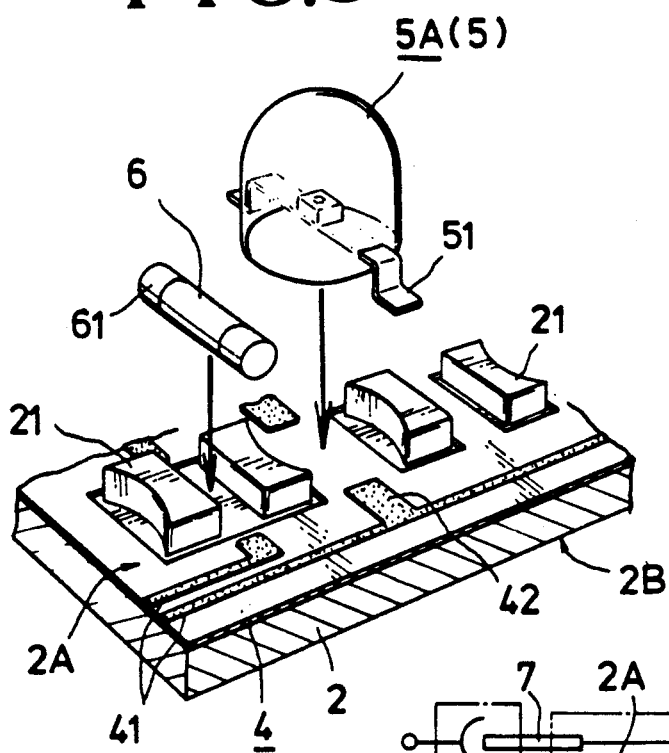
FIG. 3 is a perspective view of an important portion of the vehicle lamp.

In FIGS. 1 and 2, a reference numeral 1 shows a vehicle lamp according to the present invention, in particular FIG. 1 is a side view of the vehicle lamp part of which being broken and FIG. 2 is a front view of the lamp. It is apparent that, similar to the conventional one, the vehicle lamp 1 has a lamp chamber 1138A constructed by a housing 2 and a lens 3. In detail, the housing 2 is molded using resin, for example, an epoxy resin having heat conductivity improved by adding a filler of aluminum oxide powder thereto. As shown in FIG. 3, during a molding of the housing, a film-like substrate 4 having circuit patterns 41 formed thereon and made of, for example, copper foil is integrally formed on, for example, a polyamid resin film on an inner surface of the housing 2. The housing 2 has a convex guide portion 21 shaped so as to fit to outer diameters of constructive parts such as a current restrictive resistor 6 for the LED 5A of the light source 5, which guide portion 21 is simultaneously formed as part of the housing 2. As a result, the inner face of the housing 2 is used as a light source fixing face 2A.

The circuit patterns 41 formed on the film substrate 4 and the convex guide portion 21 correspond to the outside shape of the light source 5 (or LED 5A which is applied to flatly) or the resistor 6, and positions of the leads 51 and 61. Explaining, for example, the LEDs 5A, when the LED 5A fits to the guide portion 21, pads 42 of the circuit patterns 41 are positioned to engage of the leads 51.

Means on which the circuit patterns 41 are formed is not limited to the film substrate 4, and it may be formed by printing on the housing 2 molded.

Figure 4:
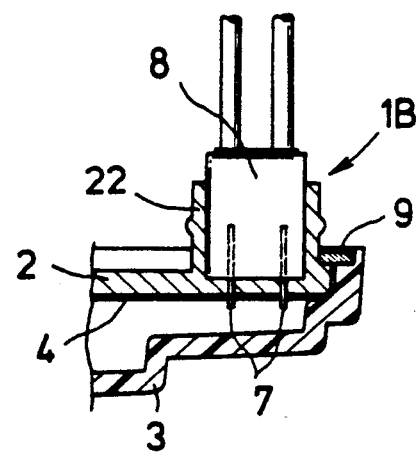
FIG. 4 is a section taken along line IV—IV of FIG. 2.

FIG. 4 shows the power source connecting portion 1B of the vehicle lamp 1 according to the present invention. When the housing 2 is molded or manufactured, a terminal 7 is inserted and molded so as to protrude by a suitable length from a side of the light source fixing face 2A or an inner face of the housing 2 to a side of the outer face 2B. The protrusion of the terminal 7 which is made of conductive member, such as metal, projects out of the outer face 2B so as to match with the pattern 41. A frame portion 22 is formed around the protruded terminal 7 so as to construct a connector receiving portion, to which receiving portion, for example, a standard marketable connector 8 is inserted. Thus, the power source connecting portion 1B is obtained.

Figure 5:
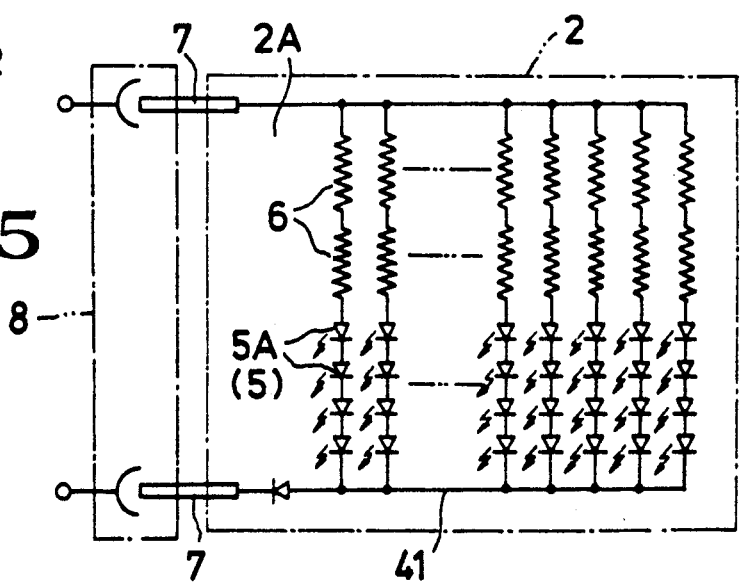
FIG. 5 is a circuit diagram showing an electric wiring of the vehicle lamp.

FIG. 5 depicts the housing 2 having the construction above by means of an electric circuit. A plurality of face-applied type LEDs 5A and resistors 6 are fixed to the light source fixing face 2A of the housing 2 at predetermined positions through the guide portions 21. The face-applied type LEDs 5A and the resistors 6 are electrically connected to each other by means of the circuit pattern 41 of the film-like substrate 4. These LEDs and resistors are connected to leads led to the outer face 2B of the housing 2 through the terminals 7 connected to the connectors 8 through which power is supplied.

Connection between the housing 2 and the lens 3 will be explained.

Because, as mentioned above, the housing 2 of the present invention has a heat conductivity improved or raised by adding a particular filler thereto, large differences in coefficients of thermal expansivity of the housing 2 and the lens 3 made of regular resin without any addition will often be generated. If there is a severe condition of surrounding temperature of these members, a large difference in thermal expansion will generate a large difference in sizes of both members resulting in deformation such as bowing or bending.

Figure 7:
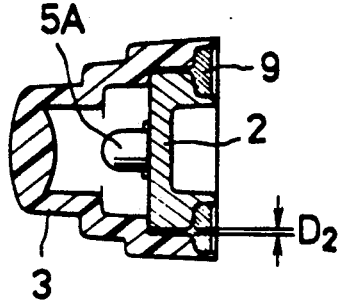
FIG. 7 is a section taken along VII—VII of FIG. 1.
Figure 6:
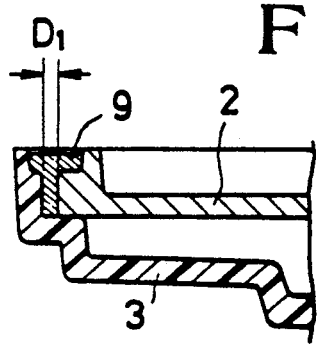
FIG. 6 is a section taken along line VI—VI of FIG. 2.

In order to solve the problem of bowing, the vehicle lamp 1 of the present invention is constructed so as to make the longitudinal clearance $D_1$ between the housing 2 and the lens 3 as shown in FIG. 6 larger than the short-axis directional clearance $D_2$ shown in FIG. 7, and an elastic seal member 9 such as a silicon rubber member having an elongation percentage of about 200% is used as a bond between the housing 2 and the lens 3.

Operative effect of the vehicle lamp 1 constructed as described above according to the present invention will be explained.

First, the light source fixing face 2A is integrally formed with the film-like substrate 4 applied to the inner face of the housing 2, so that heat generated from the face-applied LEDs 5A and the resistors 6 arranged on the light source fixing face 2A is conducted through the housing 2 reaching the outer face 2B of the housing or the outside of the vehicle lamp 1, which comes into direct contact with the atmosphere. As a result, the cooling effect of the vehicle lamp 1 is enhanced and rise in temperature of the face-applied type LEDs 5A and the resistors 6 is restricted.

Additionally, the housing 2 has a good heat conductivity obtained by adding the filler thereto, so that the heat conductivity and cooling effect are increased.

Second, the power source connecting portion 1B is formed by inserting the terminals 7 and molding the housing 2, and the housing 2 is completed simultaneously with that of the power source connecting portion 1B, so that it is possible to omit the assembling process which has been troublesome because it is done manually according to the prior art.

Third, because guide portions 21 are formed as shown in FIG. 3 on the light source fixing face 2A when the housing 2 is molded, the guide portions 21 guide and position the face-applied type LEDs 5A correctly during the LEDs installation process, resulting in orderly fixing of the LEDs. The installation process is very easy, work efficiency is increased, and the dignity and market value of the vehicle lamp are effectively improved.

Fourth, because the longitudinal or long-axial clearance between the housing 2 and the lens 3 is large, any size difference created by heat difference between the housing 2 and the lens 3 is absorbed by the clearance, preventing the vehicle lamp 1 from deforming or bowing. The flexible seal member 9 makes the joining effect sure between the housing 2 and the lens 3.

FIG. 8 depicts the second embodiment of the present invention. Comparing to the first embodiment using the face-applied type LEDs 5A as a light source 5, the vehicle lamp according to the second embodiment employs dome-type LEDs 5B which is a most popular product in market. It is noted that a light source fixing face 2A of the housing 2 has a shape of an elongated horizontal rib of the vehicle lamp 1 with concave-shaped guide portions 23 formed at the front end of the fixing face 2A. These concave-shaped guide portions 23 are adapted to receive the dome-shaped LEDs 5B in a positional condition so as to direct along shining direction or transversal direction of the vehicle lamp 1. In addition, on the light source fixing face 2A having a rib shape, pads 42 of the circuit patterns 41 are arranged so as to be in alignment with the lead terminals 51 of the dome-shaped LED 5B. The pads provided by means of the film-like substrate 4 or some printing above, so it is possible to employ the dome-shaped LEDs 5B.

FIG. 9 depicts a third embodiment of the present invention. Comparing the FIG. 9 embodiment to that in which the outer face 2B of the housing 2 is flat according to the first embodiment, the third embodiment has rib-shaped or convex portions formed on the outer face 2B which are used as a heat sink portion 24. It is natural to form the heat sink portion 24 integrally and simultaneously with the formation of the housing 2.

Due to the particular construction above of the third embodiment, the contact area of the housing 2 with the atmosphere increases and heat generated from the light source 5 and the resistor 6 provided on the light source fixing face 2A is dispersed to the atmosphere more effectively, greatly increasing the effect of the vehicle lamp.

The operative effects other than that particularly explained with reference to the second and the third embodiments of the present invention will be omitted hereinafter for brevity since these operative effects were explained with reference to the first embodiment.

Also, it is possible to combine the advantageous characteristics of the second and the third embodiments.

Characteristics and effects of the present invention will be explained. Because, first, the light source fixing face is provided on the inner face of the housing by molding of the film-like substrate carried out integrally with the light source fixing face, heat emitted from the light source and resistors, respectively arranged on the light source fixing face can be effectively dispersed directly to the atmosphere through the housing increasing cooling effect of the vehicle lamp. In particular, when the LEDs are employed and temperature in the lamp chambers rises, the rate of rise in temperature of the light source decreases preventing the LEDs from decreasing in their brightness. In addition, the housing 1 has a good heat conductivity obtained by addition of filler to the material manufacturing the housing I, so that the characteristics and effects above will more improved.

In addition, a provision of the heat sink portion formed on the outer face of the housing further strengthens the effect above.

Second, insertion-forming the terminals in the housing provides the power source connecting portion, so that the power source connecting portion can be formed simultaneously with that of the housing, substantially omitting the troublesome process of the conventional manual assembling process which has been used in the prior art.

Third, by means of previous provision of the concave or convex guide portions on the light source fixing face when the housing is molded or formed, the light sources are correctly positioned during the time they are applied to the fixing face and, in detail, the light sources are guided to the appointed positions in order without difficulty. Consequently, working efficiency of the assembling increases and the market value of the vehicle lamp 1 is improved.

Fourth, due to the long clearance in the long-axis direction of the housing between the housing and the lens, any size difference between the housing and lens generated by thermal expansion will be absorbed, so that no deformation and bowing occur in the structure of the vehicle lamp 1. Additionally, the joining effect between the housing and lens will be secured by a flexible seal member.

It is apparent that the present invention solves all problems of the conventional vehicle lamp of this kind, and excellent effects such as improvement in productivity, cost-reduction, and raised performance are obtained.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and secope of the invention herein.

What is claimed is:

1. A vehicle lamp assembly comprising a housing and a lens, said housing and said lens cooperating to define a hollow lamp chamber, a light source fixing face arranged in the lamp chamber, a plurality of lamps arranged on the light source fixing face, and a power source connecting portion formed on a part of said lamp chamber, characterized in that said housing is made of resin having a thermal conductivity improved by adding a filler thereto, said housing has an inner face on which face circuit patterns for electrical contact with each lamp are integrally formed and curved guide portions for positioning the lamp, said guide portions being used as the light source fixing face, the housing also having terminals protruding from the fixing face to the outside of the housing, which terminals serve as the power source connecting housing and said assembly have a large clearance gap, formed between the housing and lens, along a long-axis direction of the vehicle lamp and said housing and said lens being joined through a flexible seal member arranged in said gap to seal said lamp chamber.

2. The vehicle lamp according to claim 1, wherein the housing has a rib functioning as a heat sink, which rib is formed on the outside face of the housing.

3. A lamp assembly for vehicles and the like comprising:
   a housing for supporting a plurality of lamp sources;
   a lens member;
   said housing having an engaging periphery;
   said lens member having an engaging periphery for engaging said housing periphery when said lens member and housing are fitted together;
   said lens member and housing, when fitted together, defining a hollow interior lamp chamber;
   a surface of said housing within said hollow lamp chamber being provided with guide portions for receiving and accurately positioning the lamp source and at least one associated electrical component;
   connection means for electrical connection with an external power source extending through said housing and into said hollow chamber;
   a printed circuit pattern arranged on said housing surface for electrically connecting said lamp source and electrical component to said connection means for coupling with an external power source; and
   said printed circuit arrangement electrically engaging terminals provided on said lamp source and circuit component when said lamp source and circuit component are arranged on said fixing face and properly positioned by said guide members.

4. The lamp assembly of claim 3 wherein the lens and housing are sized so that the peripheral mating portions are separated by a gap;
   a resilient flexible seal member arranged within said gap for sealing the hollow interior chamber from the surrounding atmosphere and being sufficiently resilient to be compressed due to expansion and/or contraction of said gap to compensate for expansion and contraction of said housing and/or lens member.

5. The lamp assembly of claim 4 wherein said lamp member and said housing are both elongated members, each having a length substantially greater than their width to define two short and two long sides;
   the gap provided between the engaging short sides of said lens and housing being greater than the gap provided between the adjacent long sides of said lens and housing.

6. The lamp assembly of claim 3 wherein said housing is formed of a resin having a filler added thereto which increases the thermal conductivity of said housing to enhance the loss of heat generated within said hollow chamber to the surrounding atmosphere.

7. The lamp assembly of claim 3 wherein the guide portions comprise at least a pair of projections spaced to receive a lamp source therebetween.

8. The lamp assembly of claim 7 wherein said lamp source has a substantially annular periphery;

the facing portions of said projections receiving said lamp source having concave peripheries conforming to the shape of said lamp source.

9. The lamp assembly of claim 3 wherein said electronic component comprises a resistor having electrical terminals at opposite ends thereof;

said guide portions comprising a pair of spaced-apart projections, the faces of said projections for engaging said electronic component having shapes conforming to the surface portions of the electronic component engaging said faces.

10. The lamp assembly of claim 3 wherein the external surface of said housing directed to the surrounding atmosphere is provided with a surface having undulations to increase the surface area thereof exposed to the atmosphere.

11. The lamp assembly of claim 10 wherein said undulations comprise a plurality of ribs.

12. The lamp assembly of claim 3 wherein said housing is provided with an integral rib projecting into said lens;

said rib having a cut-out portion for receiving a lamp source;

the cut-out portion having a configuration conforming to the peripheral portion of the lamp source engaging the contoured surfaces of said cut-out;

said lamp source having a pair of electrical terminals; and said printed circuit means having portions thereof for engaging the electrical terminals of said lamp source when it is positioned within said cut-out portion.

* * * * *

UNITED STATES PATENT AND TRADEMARK OFFICE
CERTIFICATE OF CORRECTION

PATENT NO. : 5,038,255

DATED : August 6, 1991

INVENTOR(S) : Nishihashi et al

It is certified that error appears in the above-identified patent and that said Letters Patent is hereby corrected as shown below:

On the title page item [30]

After the title "Foreign Application Priority Data", the date should be -- November 6, 1989--

Column 2, line 51, "1138A" should be --1A--

Column 3, line 5, "engage of the" should be --engage the--

Signed and Sealed this

Nineteenth Day of January, 1993

Attest:

DOUGLAS B. COMER

*Attesting Officer*  Acting Commissioner of Patents and Trademarks